United States Patent [19]

Kasahara et al.

[11] Patent Number: 5,231,303
[45] Date of Patent: Jul. 27, 1993

[54] SEMICONDUCTOR DEVICE WITH INCORPORATED STRESS REDUCING MEANS

[75] Inventors: Yoshihiko Kasahara; Tatsuro Ito, both of Suwa, Japan

[73] Assignee: Seiko Epson Corporation, Tokyo, Japan

[21] Appl. No.: 696,698

[22] Filed: May 7, 1991

[30] Foreign Application Priority Data

| May 8, 1990 | [JP] | Japan | 2-118427 |
| May 16, 1990 | [JP] | Japan | 2-51113 |
| May 16, 1990 | [JP] | Japan | 2-126140 |
| Apr. 12, 1991 | [JP] | Japan | 3-80068 |

[51] Int. Cl.⁵ .................................. H01L 23/28
[52] U.S. Cl. ............................ 257/669; 257/666; 257/673; 257/787
[58] Field of Search .................... 357/72, 74, 70; 257/666, 673, 669, 787, 735, 773, 676

[56] References Cited

U.S. PATENT DOCUMENTS

| 4,736,236 | 4/1988 | Butt | 357/70 |
| 4,743,956 | 5/1988 | Olla et al. | 357/70 |
| 5,031,022 | 7/1991 | Yamamoto et al. | 357/72 |

*Primary Examiner*—William Mintel
*Assistant Examiner*—Roy Potter
*Attorney, Agent, or Firm*—W. Douglas Carothers, Jr.

[57] ABSTRACT

A semiconductor device comprises a semiconductor chip mounted within a prepared aperture formed in a flexible film carrier. A conductive lead pattern is formed on the surface of the film carrier and the inner lead ends of the lead pattern project over and into the film aperture in aligned relation with a plurality of bonding pads formed on the active surface of the semiconductor chip. The semiconductor chip, or the semiconductor chip together with inner portions of the conductive lead pattern, are encapsulated with a sealing resin to the film carrier. A spatial interval, A defined by the edge of the carrier aperture and the edge of the outer side periphery of the semiconductor chip to be installed in the device aperture, is set within the range of about 0.4 mm to 0.8 mm. Also, the inner leads are provide with a small extended length, preferably in those portions extending into and over the device aperture. Further, slack lead portions or flexible carrier support members may be provided for the inner leads to absorb stresses occurring from transport and handling of the semiconductor device after connection of the inner lead ends with the semiconductor chip bonding pads as well as stresses occurring due to thermal resin sealing and setting during the step of device resin encapsulation.

18 Claims, 6 Drawing Sheets

SEMICONDUCTOR DEVICE WITH INCORPORATED STRESS REDUCING MEANS

BACKGROUND OF THE INVENTION

This invention relates generally to a semiconductor device comprising a semiconductor IC chip mounted on a carrier tape and, more particularly, to formation of such a semiconductor device without lead breakage or damage occurring during encapsulation.

Figure 6:
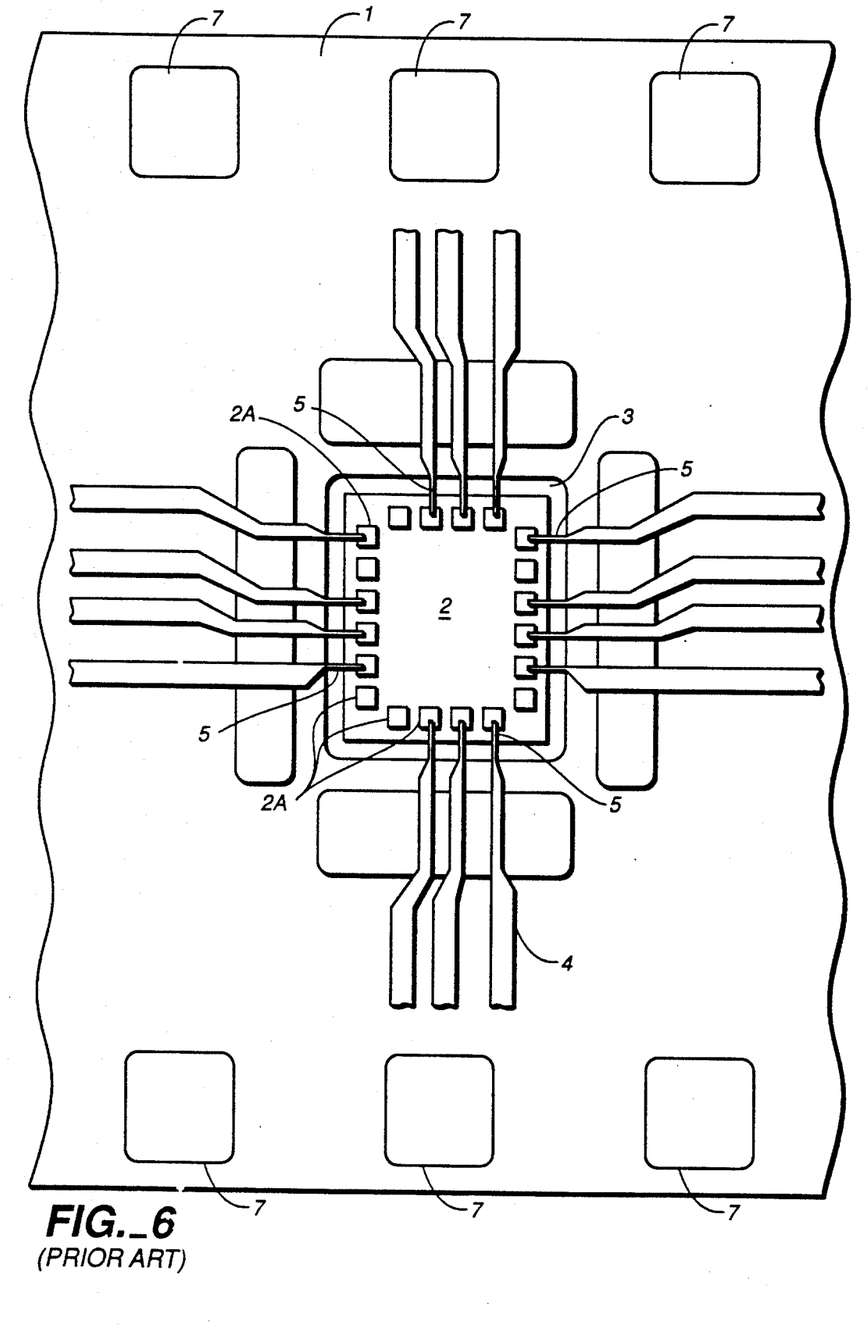
FIG. 6 is a plan view illustrating a semiconductor device made according to the prior art prior to encapsulation.
Figure 7:
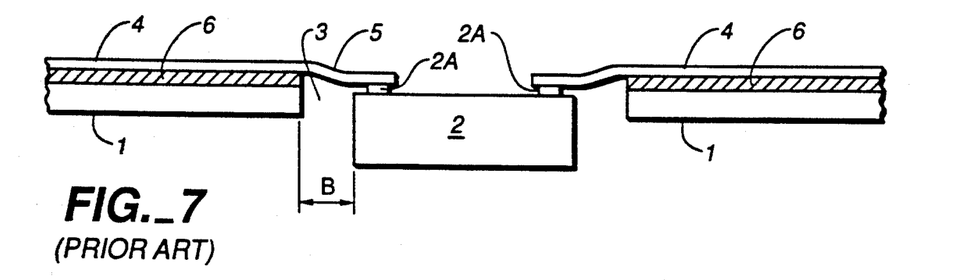
FIG. 7 is a cross sectional view illustrating the semiconductor device of FIG. 6 prior to encapsulation.
Figure 8:
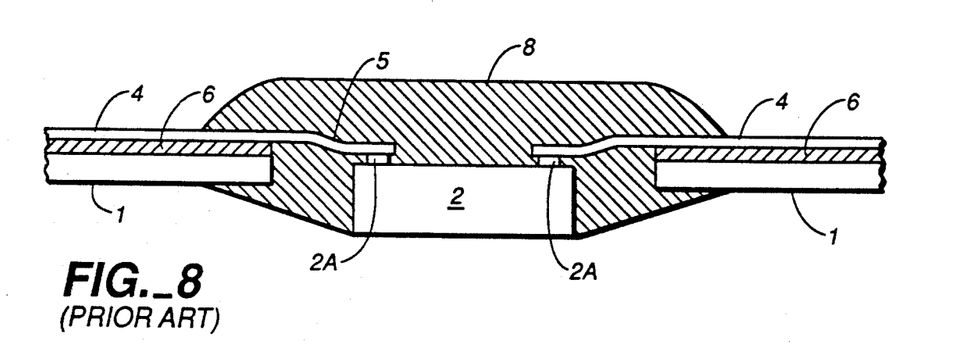
FIG. 8 is a cross sectional view illustrating the semiconductor device of FIG. 6 after encapsulation.
Figure 9:
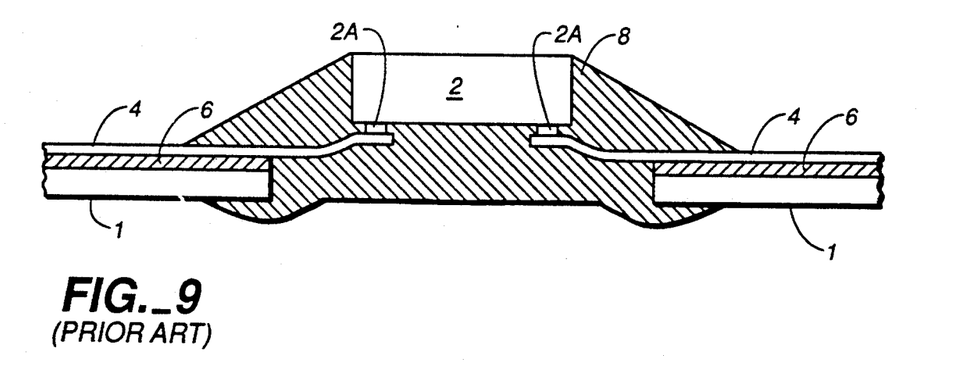
FIG. 9 is a cross sectional view illustrating the semiconductor device of FIG. 6 after an alternative type of encapsulation.
Figure 10:
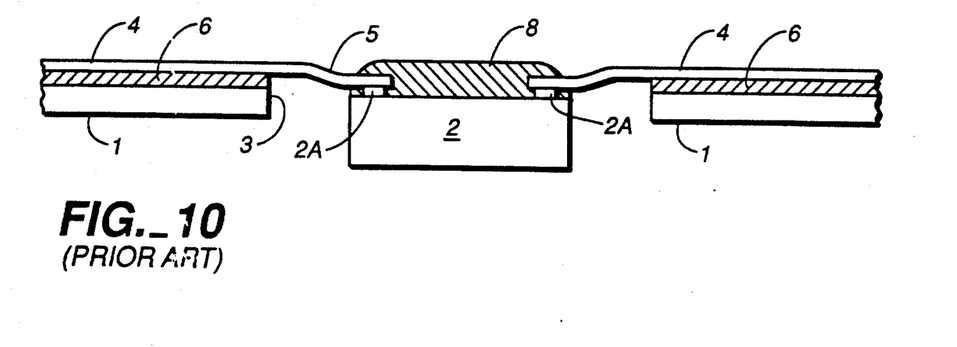
FIG. 10 is a cross sectional view illustrating the semiconductor device of FIG. 6 after a still further alternative type of encapsulation.
Figure 11A:
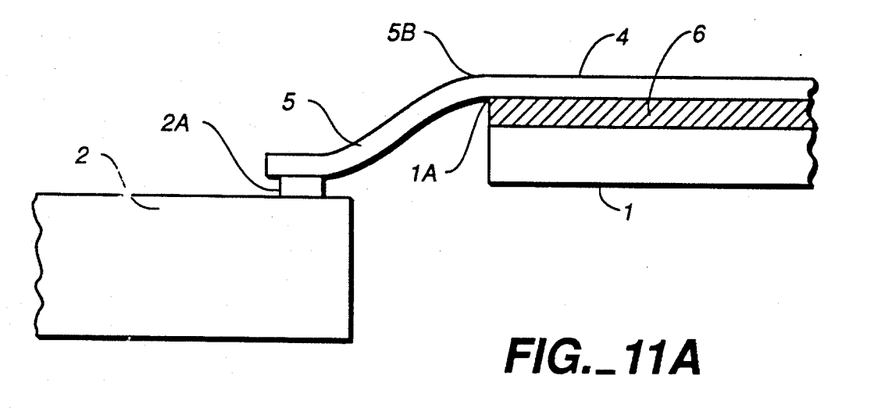
FIGS. 11A and 11B are enlarged cross sectional views illustrating the process by which the inner leads of the semiconductor device and their connections are broken and damaged due to subsequent encapsulation and handling.
Figure 11B:
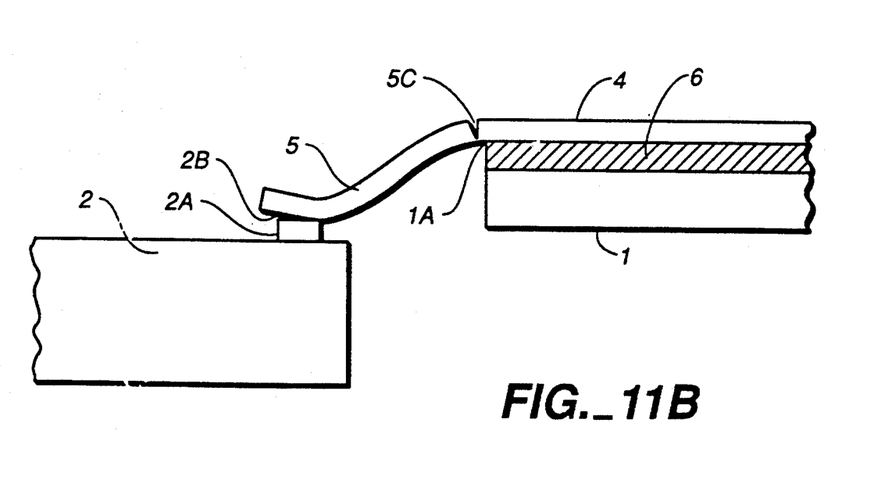

Reference is made to FIGS. 6–11B for purposes of illustrating the state of the prior art of semiconductor devices of the type which comprise a semiconductor integrated circuit chip is mounted on a flexible film carrier which includes a conductive pattern comprising a plurality of thin metal leads superimposed on the surface of the film carrier. The inner leads of the pattern are connected to bonding pads on the IC chip. FIG. 6 is a plan view illustrates the condition of such a semiconductor device prior to sealing or encapsulation. FIG. 7 is a sectional view of the semiconductor device of FIG. 6 prior to encapsulation. FIG. 8 is a sectional view illustrating the condition of the semiconductor device of FIG. 6 after encapsulation. FIG. 9 is a sectional view illustrating the condition of the semiconductor device of FIG. 6 after imposition of an alternative type of encapsulation. FIG. 10 is a sectional view illustrating the condition of the semiconductor device of FIG. 6 after imposition of a still further tupe of encapsulation. FIGS. 11A and 11B are sectional views to illustrate how and where the inner leads of the semiconductor device of FIG. 6 are broken or cracked, or the inner lead ends are disengaged or partially disengaged from bonding pads due to subsequent handling and encapsulation processing.

As shown in FIGS. 6–10, film carrier 1 is formed of insulating film, which is approximately 50-125 mm thick and comprises, for example, a polymer material, such as, polyester or polyimide. Film carrier 1 is provided with series of sprocket holes 7 for its transport, and, further, contains a series of chip mounting apertures, wherein one such aperture 3, within which semiconductor IC chip 2 is mounted. The surface area of aperture 3 is made larger than surface area of chip 2. Semiconductor IC chip 2 comprises a semiconductor integrated circuit having a plurality electrode terminals or bonding pads 2A formed on the active surface of IC chip 2. A conductive pattern of leads 4, which may be comprised of copper metal foil having a width generally in the range of 50 mm to 300 mm and a thickness in the range of 15 mm to 40 mm thick, are secured to flexible film carrier 1 by means of adhesive 6. Inner leads 5 of pattern leads 4 project into aperture 3 from the aperture edge so that the lead tips or ends are free, i.e., suspended in cantilever fashion over aperture 3. The conductive pattern leads 4 are arranged in aligned relation to the configuration of bonding pads 2A of semiconductor chip 2 to extend over device aperture 3 of film carrier 1 and over the active surface of chip 2 transverse relative to the peripheral edge of chip 2.

In practice, spatial interval, B, in FIG. 7, i.e., the spacing between the edge of aperture 3 and the side surface edge of chip 2, is generally within the range of 0.15 mm to 0.40 mm. The ends of inner leads 5 are connected, e.g., by pressure melt adhesion to bonding pads 2A of semiconductor chip 2 positioned within opening 3 of film carrier 1. After the ends of inner leads 5 and electrodes 2A of semiconductor chip 2 are connected, chip 2 and a portion of conductive pattern leads 4 are sealed or encapsulated by means of sealing resin 8, as illustrated in FIG. 8. This encapsulation process may be accomplished by methods known in the art, such as, by a squeegee printing process or a resin bonding process. Then, the outer extremities of film carrier 1 and conductive pattern leads 4 are severed or trimmed to complete the construction of the semiconductor device.

In FIG. 9, semiconductor chip 2 and portions of conductive pattern leads 4 are encapsulated with sealing resin 8 after bonding pads 2A of chip 2 and the ends of inner leads 5 have been connected but with the active surface of chip 2 positioned to be facing downward or in a direction opposite to the exposure direction of the pattern of leads 4.

In FIG. 10, only the active surface of semiconductor chip 2 is encapsulated by means of sealing resin 8 after chip bonding pads 2A have been connected to the ends of inner leads 5. In this structure, the semiconductor device may be severed from film carrier 1 along a position along the spacing formed between the film aperture 3 and the outer peripheral edge of chip 2 by cutting inner leads 5 or along a position in the body of carrier 1 encircling aperture 3 thereby including a portion of inner leads 5 as secured to the carrier body.

When semiconductor chip 2 is connected to inner leads 5 with its active surface facing upward, as illustrated in FIGS. 7 and 8, inner leads 5 are suspended from film carrier 1, as seen enlarged in FIG. 11A, so that chip 2 is held in a hanging or suspended condition. Because inner leads 5 are generally made of a comparatively soft material, such as, copper having, for example, a thickness on the order of 40 mm, whereas film carrier 1 is made of harder material, such as, polyimide resin having, for example, a thickness on the order of 100 mm, a force, due to the suspension of chip 2 held by the multiple leads 4, is concentrated at points 5B of inner leads 5 along the position of aperture edge 1A. This eventually leads to the occurrence of cracks or breaks occurring at point 5B, shown at 5C in FIG. 11B, due to expansion and contraction of leads 4 over changing temperature conditions as well as tension and torsion from handling the semiconductor device during processing.

Further, when chip 2 and a portion of conductive pattern leads 4 are encapsulated with sealing resin 8, such as, shown in FIGS. 8 and 9, stress, such as, (1) heat stress during device fabrication and encapsulation and (2) mechanical stress occurring during curing and hardening of resin 8, which is in contact with inner leads 5, is concentrated at points 5B resulting in lead breaks or cracks 5C. Also, the connections of the ends of inner leads 5 to chip 2 become loosened, disengaged or partially disengaged, shown at 2B in FIG. 11B, due to the torsional effect brought upon inner leads 5 during the encapsulation and cooling of the resin sealant 8 so that poorly bonded lead/pad connections result and good electrical contact is not achieved in the end product.

Lastly, when only the active surface of semiconductor chip 2 is encapsulated with sealing resin 8 after inner leads 5 are connected to chip 2 by bonding, as illustrated in FIG. 10, external stress, resulting from the handling and transport of the semiconductor device in processing carried out after bonding and encapsulation of inner leads 5 has been accomplished, is concentrated at points 5B leading to lead breaks and fractures 5C. Further, the connections previously formed between the ends of inner leads 5 and semiconductor chip 2 become loosened or partially disengaged, which provides for poor quality bonding connections as well as poor electrical connections.

It is an object of this invention to resolve the foregoing described problems of the prior art It is an object of this invention to provide a semiconductor device with little occurrence of inner bonding breakage and poor bonding connections resulting in a high yield production of semiconductor devices.

SUMMARY OF THE INVENTION

According to this invention, a semiconductor device comprises a semiconductor chip mounted within a prepared opening or aperture formed in a flexible film carrier. A conductive lead pattern is formed on the surface of the film carrier and the inner leads of the lead pattern project over into the film aperture in aligned relation to a plurality of bonding pads formed on the active surface of the semiconductor chip. Bonding of the inner ends of the leads to corresponding bonding pads is thereafter carried out. Then, the semiconductor chip, or the semiconductor chip together with inner portions of the conductive lead pattern, are encapsulated with a sealing resin to the film carrier. A spatial interval, A, defined by the edge of the film carrier aperture for placement of the semiconductor device and the edge of the outer side periphery of the semiconductor chip to be installed in the device aperture, is set within the range of about 0.4 mm to 0.8 mm. Also, the inner leads may be extended to have additional length. Further, slack lead portions, such as, elbow bends, may be formed at substantially intermediate positions of the inner leads. Also, cut-out portions may also be formed in the film carrier in regions between adjacent conductive pattern leads extending from the edge of the film carrier aperture into the body of the film carrier. In a preferred form of the invention, these film carrier cut-out portions are provided to have a long and narrow elongated shape. These types of formed portions effectively reduce the stress occurring due to (1) from transport and handling of the semiconductor device after connection of the inner lead ends to the semiconductor chip bonding pads and (2) temperature changes during thermal resin encapsulation and setting during the step of resin sealing.

The preferred spatial interval, A, in the range of 0.4 mm to 0.8 mm reduces the bending stress imposed upon the leads because of the increase in length of the inner leads and the increase in width of the spatial interval. Further, either the lengths of the inner leads projecting into the device aperture are extended to render them more pliant or flexible, or the slack lead portions are provided substantially midway of the inner leads rendering them more pliant and flexible along their length. As a result, the inner leads will bend under stresses applied during encapsulation of the semiconductor device or during setting of the sealing resin in the resin sealing step so that little or no damage results to the inner leads. Also, physical stresses imposed upon the inner leads occurring during transport and handling, after the inner lead/chip bonding pad connection, does not cause damage since the bent or slack lead portions of the inner leads will absorb these stresses without subsequent development of poor bonding pad connections and lead breakage of the inner leads.

Further, tongue portions or flexible carrier support members are formed along film carrier aperture by providing elongated cut-out portions between adjacent aperture pattern leads so that the leads are supported on the extended tongue portions. As a result, the tongue portions are easily pliable, in a gentile manner, and flex in a direction parallel with the inner leads superimposed thereon. Because a gradual bend is provided by the structure of the tongue portions, formed stresses are not locally concentrated at one or more positions or points along the length of the inner lead, such as previously illustrated at 5B in FIG. 11A. Thus, the inner leads bend together with the film carrier tongue portion in response to applied external forces, such as, (1) expansion and contraction forces due to temperature changes occurring during encapsulation and cooling or other processing steps, as well as due to environmental temperature changes during use, and (2) due to mechanical tension applied at the point of inner lead/bonding pad connection. ,As a result, there is no local concentration of forces along the length of the inner leads as well as at their point of bonding pad connection. Also, occurrences of poor bonding connections and lead breaks in inner leads that have occurred due to such external forces are significantly reduced.

Other objects and attainments together with a fuller understanding of the invention will become apparent and appreciated by refering to the following description and claims taken in conjunction with the accompanying drawings.

DESCRIPTION OF THE PREFERRED EMBODIMENTS

Figure 1:
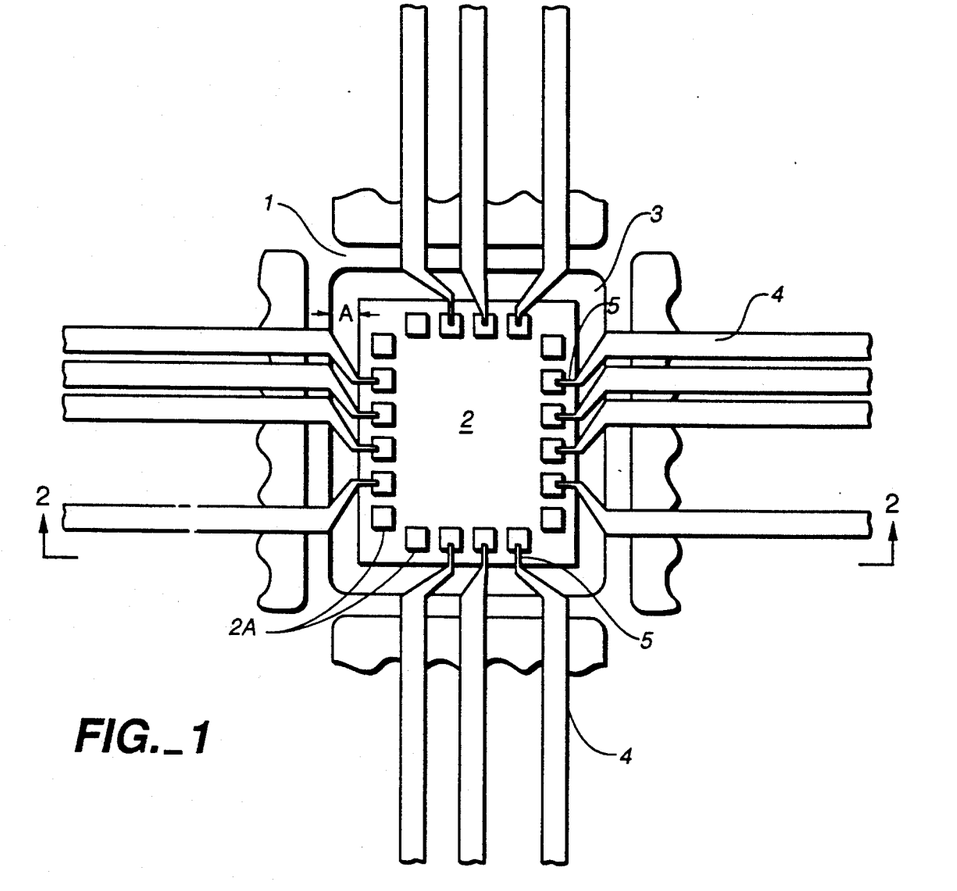
FIG. 1 is a plan view illustrating a first embodiment of this invention prior to encapsulation.
Figure 2:
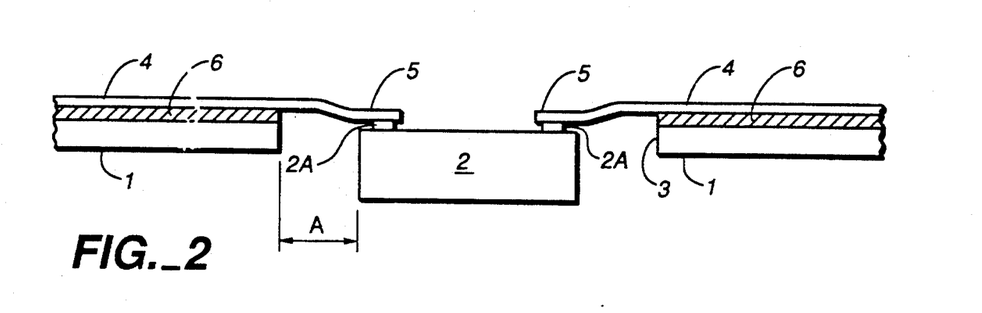
FIG. 2 is a cross sectional view illustrating the embodiment of FIG. 1 prior to encapsulation.

Reference is now made to FIGS. 1 and 2 wherein components of the semiconductor device identical to the prior art embodiments of FIGS. 6-10 are indicated with the same numerical identification. In the embodiment of FIGS. 1 and 2, the spatial interval, A, formed between the edge of the outer side periphery of semiconductor chip 2, positioned within aperture 3 and the edge of aperture 3, is provided to be within the range of about 0.4 mm to 0.8 mm. In addition, the length of the portions of inner leads 5 extending over and into aperture 3 are formed to be longer, as best seen in FIG. 2 when compared with FIG. 7. Thus, after inner leads 5 and semiconductor chip 2 have been connected, semiconductor chip 2 and inner portions of conductive pattern leads 4 together with a portion of film carrier 1 are encapsulated with sealing resin (not shown). After this, outer portions of film carrier 1 and conductive pattern leads 4 are trimmed to complete the construction of the semiconductor device.

Table 1 below sets forth the results of investigation of lead break yields relative to inner leads 5 of semiconductor devices on film carriers relative to the embodiment illustrated in FIGS. 1 and 2 wherein the spatial interval, A, was divided into four different groups, and the lead break yields and total yields were determined as acceptable (O) or unacceptable (X). Relative to the testing of 100 examples for each of the four groups, the type of lead 5 employed was copper, and the width and thickness of lead ends secured to electrode pads 2A were, respectively, 60 μm and 35 μm. The outer dimensions of pads 2A were 80 μm by 80 μm. Thus, the tolerance relative to lead/pad width was 20 mm.

The criteria determinative of defective parts is identified as items (1), (2) and (3) in Table 1. Lead Break (1) is the condition wherein inspection reveals that a break in a connected lead has occurred so that the connection is defective. This defect condition appears enhanced if spatial interval, A, is rendered too small.

interval, A, was 0.4 mm to 0.6 mm and 0.6 mm to 0.8 mm, there was substantially no lead breaks and provide better total yields over the examples having a spatial interval in the range of 0.15 mm to 0.40 mm. We have discovered that if the spatial interval, A, in combination with a corresponding extension of inner lead 5 is extended to be greater than 0.40 mm but is not extended to be greater than 0.80 mm, the yield break and the resultant total yield are materially reduced. This is, in part, due to spatial interval, A, being wider than that employed in the prior art structures, and, also, because of the extended lengths of inner leads 5 render them more pliant and flexible at their lengthened portions. This approach has not been appreciated by those in the art. As a result, after the connection of inner leads 5 and chip pads 2A, inner leads 5 are more flexible and pliable under imposed stresses from bending and flexure of film carrier 1 or due to transport and handling of the semiconductor device as well as stresses occurring during the setting of the sealing resin encapsulation of semiconductor chip 2 or its active surface encapsulation. Thus, these stresses are absorbeed and their damaging affects are relaxed due to the construction of the semiconductor device of this invention. Because inner leads 5 bend and absorb these external stresses, the lead breaks in inner leads 5 and the development of poor bonding connections of inner lead/bonding pad connections are substantially reduced.

Relative to the prior art semiconductor device encapsulated with the active surface of semiconductor chip 2 facing downward, as illustrated in FIG. 9, by setting the

TABLE 1

| Spatial Interval, A (mm) | 0.15–0.40 | 0.40–0.60 | 0.60–0.80 | 0.80 | Remarks |
| --- | --- | --- | --- | --- | --- |
| Lead Break Yield | | | | | |
| (1) Lead Break | 10/100 | 0/100 | 0/100 | 0/100 | No. of defects/No. of Samples |
| Yield | 90% | 100% | 100% | 100% | No. of defects/No. of Samples × 100% |
| O = Good | X | O | O | O | Yield Criteria |
| X = Bad | | | | | >95% = Good |
| | | | | | <95% = Bad |
| Total Yield | | | | | |
| (1) Lead Break | 10/100 | 0/100 | 0/100 | 0/100 | No. of defects/No. of Samples |
| (2) Position Aberration | 2/100 | 1/100 | 1/100 | 15/100 | |
| (3) Edge Short | 3/100 | 1/100 | 0/100 | 5/100 | |
| (4) = (1) + (2) + (3) | 15/100 | 2/100 | 1/100 | 20/100 | |
| (4) % Yield | 85% | 98% | 99% | 80% | No. of defects/No. of Samples × 100% |
| O = Good | X | O | O | X | Yield Criteria |
| X = Bad | | | | | >95% = Good |
| | | | | | <95% = Bad |

Position aberration (2) is the condition wherein an inner lead 5 is connected or bonded to an electrode pad 2A either in a relatively centered position on the pad or is relatively offset therefrom and overlapping the edges of the pad. If over one-third of the width of the inner lead, e.g., over 20 μm, overlaps the outer edge of an electrode pad, the connection is considered defective. If less than one-third of the width of the inner lead, e.g., under 20 μm, overlaps the outer edge of an electrode pad, the connection is considered good. This defect condition appears enhanced if spatial interval, A, is rendered too large.

Edge short (3) is the condition wherein the inner lead portion adjacent to its pad connection contacts the edge of the IC chip so that an electrical short condition is created, and the connection is considered defective. This defect condition appears enhanced if spatial interval, A, is either rendered too small or too large.

As can be seen from Table 1, with those examples of this invention wherein the groups where the spatial spatial interval, A, formed by the edge of device aperture 3 and the edge of the outer side periphery of semiconductor chip 2 positioned within device aperture 3, at 0.4 to 0.8 mm, as depicted in FIGS. 1 and 2, and concurrently imparting additional pliancy and flexibility to inner leads 5 by extending their length, inner leads 5 are made more flexible to the stresses both occurring from transport and handling after inner lead/pad bonding as well as occurring during resin setting. As a result, these stresses are absorbed preventing damage to the semiconductor device thereby increasing total yields of semiconductor devices.

Relative to the prior semiconductor device encapsulated on the active surface of semiconductor chip 2, as illustrated in FIG. 10, this device results in additional stresses formed during severing or trimming of the outer form or extremities of the semiconductor device because the inner leads are exposed externally after resin encapsulation. However, by setting the spatial interval, A, within the range of 0.4 to 0.8 mm, and concurrently imparting additional pliancy and flexibility to inner leads 5 by extending their length, inner leads 5 are made more flexible to these stresses both occurring from transport and handling and occurring during resin setting. As a result, these stresses are effectively absorbed, preventing damage to the semiconductor device and resulting in increased total yields of semiconductor devices.

Figure 3:
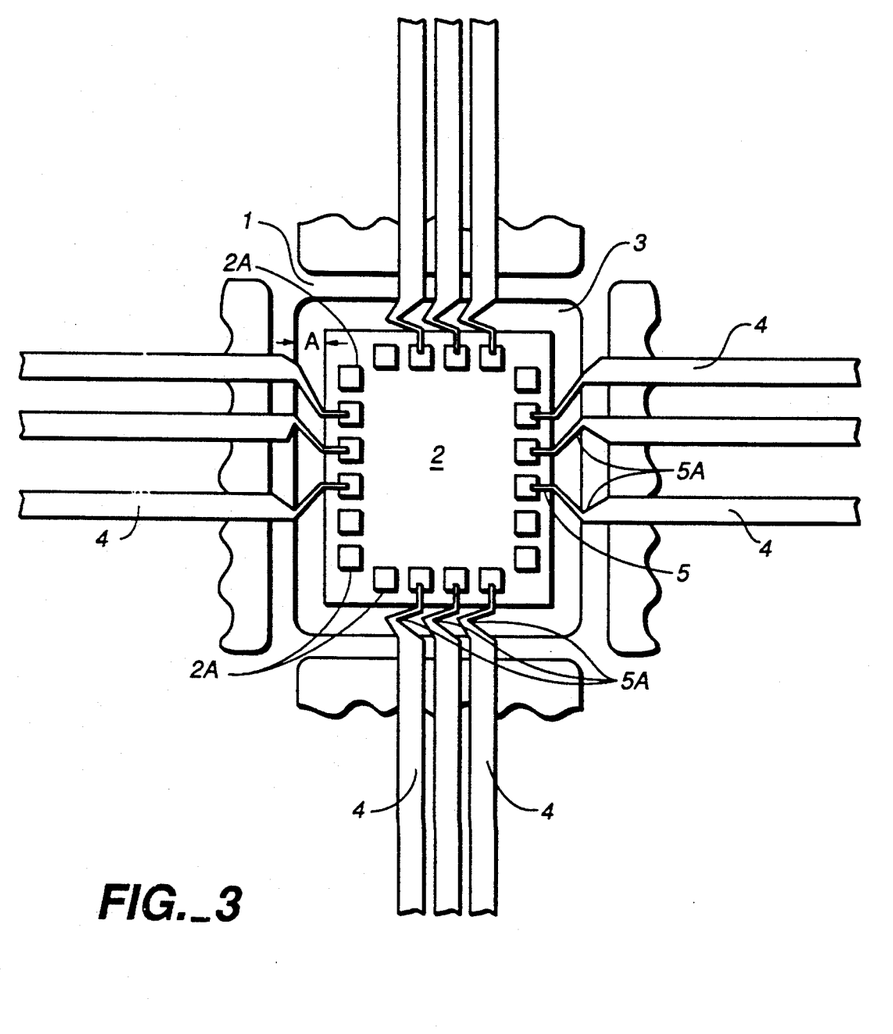
FIG. 3 is a plan view illustrating a second embodiment of this invention prior to encapsulation.

FIG. 3 is a plan view illustrating the condition of another embodiment of this invention prior to encapsulation with a sealing resin. In this embodiment, components identical to those described in previous figures are provided with the same numerical identification and the description thereof equally applies to the description of this embodiment. The added feature of this embodiment is the employment of slack lead portions 5A which may be elbow bends positioned substantially midway of inner leads 5. Portions 5A may be substantially formed in the region over the spatial interval between semiconductor chip 2 and the edge of aperture 3. Consequently, the lengths of inner leads 5 are extended so that inner leads 5 are more pliant and resilient to later occurring externally applied stresses. Because of the extended length of inner leads 5 due to the provision of a bend or curved portion, an accordion or serpentine portion, or looped section at slack lead portions 5A, stresses occurring from, for example, torsional distortions in film carrier 1 arising from transport and handling after inner lead bonding and contraction stresses occurring during resin encapsulation of semiconductor chip 2, are absorbed and their affects relaxed. Because inner leads 5 pliably yield at these slack lead portions 5A to absorb such external stresses, the breaks or cracks that have occurred in the past in inner leads 5 as well as the occurrence of poor bonding or loosened bonding connections at the inner lead/ bonding pad connections have significantly decreased.

Reference is now made again to the prior semiconductor device of the type shown in FIG. 9 with the active surface of the semiconductor chip facing in a downward direction, and also to the prior semiconductor device shown in FIG. 10 where only the active surface of the semiconductor chip is resin encapsulated, stresses tend to occur during severing or trimming of the outer extremities due to exposure of portions of the individual inner leads after encapsulation. The provision of slack portions substantially midway of the length of inner leads 5, or the extension of the inner lead lengths substantially as exemplified in FIGS. 1 and 2, imparts pliancy and flexibility to inner leads 5. Inner leads 5 with portions 5A yield to stresses occurring from transport and handling after lead bonding and after chip or chip active surface encapsulation and to stresses occurring during setting of the sealing resin. As a result, these stresses are absorbed and their damaging affects relaxed, resulting in higher yields of produced semiconductor devices.

Figure 4:
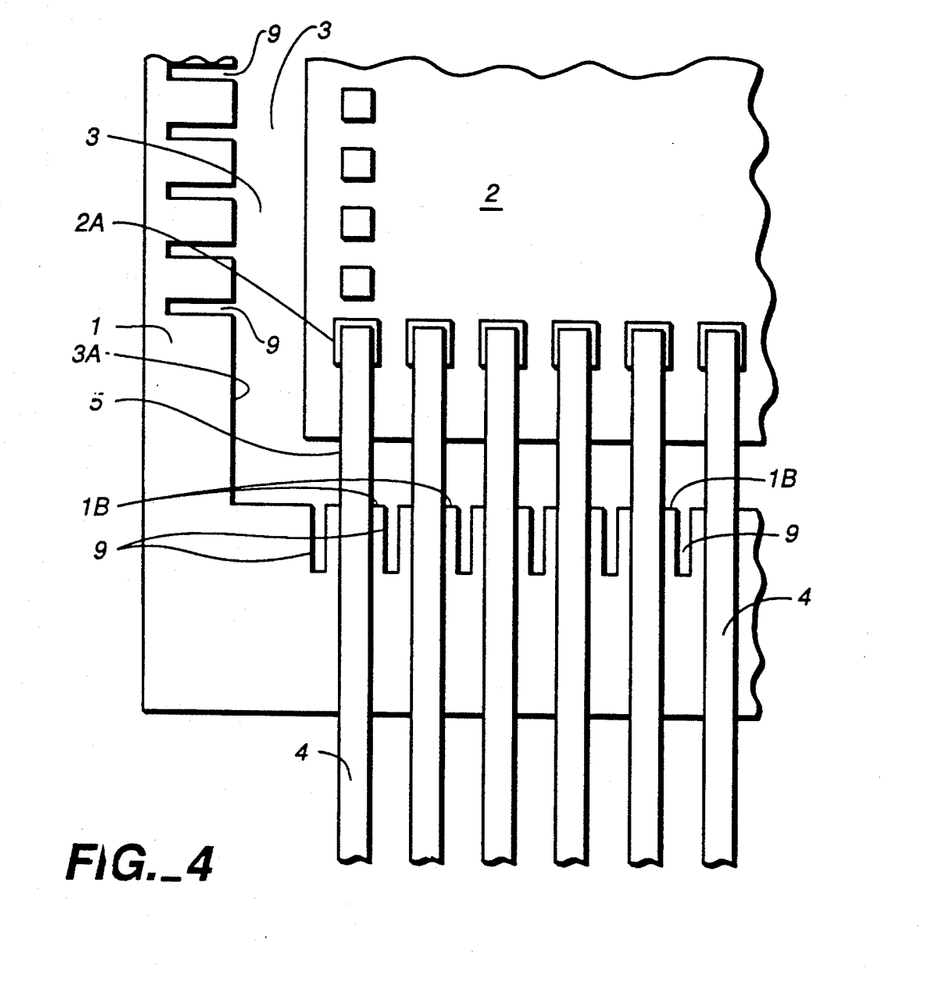
FIG. 4 is a partial plan view illustrating a third embodiment of this invention prior to encapsulation.
Figure 5:
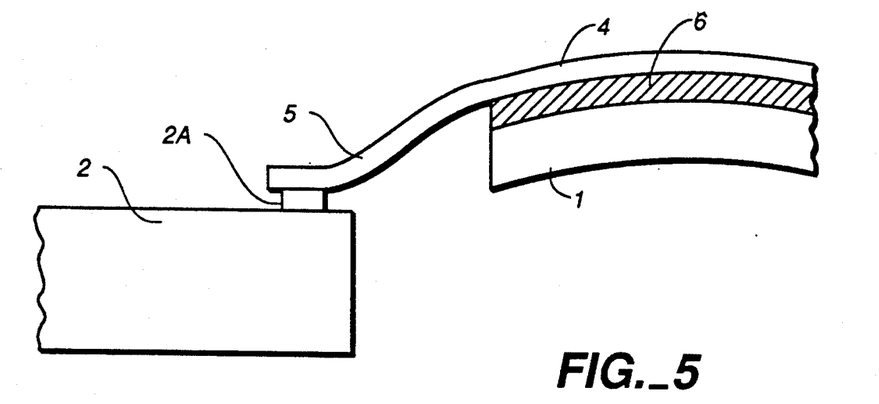
FIG. 5 is a partial plan view illustrating the embodiment of FIG. 4 prior to encapsulation.

FIG. 4 is a partial plan view illustrating the condition of another embodiment of this invention prior to encapsulation with a sealing resin. FIG. 5 is a partial sectional view for the same embodiment. In this embodiment, components identical to those described in previous figures are provided with the same numerical identification and the description thereof equally applies to the description of this embodiment. The added feature of this embodiment is the employment of cut-out portions 9 which may be comprised of long and narrow elongated shaped slots formed along edge 3A of aperture 3. Slots 9 extend in a direction away from aperture 3 into the body of film carrier 1 and, further, are provided at positions on adjacent sides of individual pattern leads 4. As a result, cut-out portions or slots 9 form tongue portions of flexible carrier support members 1B for individual leads 4 as they extend over and into aperture 3. Tongue portions 1B, therefore, function as resilient platforms which pliably support the extension of inner leads 5 into the region of aperture 3. Inner leads 5, together with tongue portions 1B, flexibly yield to external forces, such as, tension, torsion, expansion and contraction forces occurring from temperature changes that arise after inner lead/chip pad connection. Further, there is no local concentration of forces along the length of inner leads 5, particularly at point 5B depicted in FIG. 11A. Also, lead breaks in inner leads 5 that have occurred due to these external forces and the disengagement or partial disengagement of bonding pad/inner lead end connections are materially reduced.

With respect to the prior construction of the semiconductor device depicted in FIG. 8 wherein the active surface of semiconductor chip 2 is mounted face downward and the prior construction of the semiconductor device depicted FIG. 10 wherein the semiconductor chip active surface per se is encapsulated by resin sealing, stresses on the lead structure occurring during the severing or trimming of the outer form or extremities are absorbed. This is a result of the employment of elongated cut-out portions 9 that form flexible members 1B that provide a resilient platform for support of the extension of inner leads 5 into aperture 3, resulting in elimination of local concentrations of forces at local points along the length of inner leads 5, such as, at point 5B. Inner leads 5 yield and flex together with tongue portions 1B relative to external forces, such as, tension, torsion, expansion and contraction forces caused by temperature variations occurring after inner lead/chip pad connection so that these external forces are effectively absorbed and their damaging affects relaxed.

It should be understood that the teachings of this invention also include combinations of the three embodiments described relative to FIGS. 1-2, FIG. 3, and FIGS. 4-5. In this connection, the embodiment of FIGS. 1-2 can be combined with the embodiment of FIG. 3; the embodiment of FIGS. 1-2 can be combined with the embodiment of FIGS. 4-5; the embodiment of FIG. 3 can be combined with the embodiment of FIGS. 4-5; and the embodiment of FIGS. 1-2, FIG. 3 and FIGS. 4-5 can be combined together, to achieve the desired results of this invention of reducing lead breakage and cracking and the development of poor pad/lead connections significantly increasing the yield of produced semiconductor devices.

In summary, we have discovered that the spatial interval A, defined as the spacing between the edge of device aperture 3 and the outer side peripheral edge of semiconductor chip 2, is preferably maintained within the range of 0.4 mm to 0.8 mm, and, in combination with enhanced pliancy and fexibility provided by extended lengths of inner leads 5 relative to those portions extending into and over aperture 3 or, alternatively, added pliancy and fexibility furnished by slack lead portions 5A, such as bent elbows, positioned substantially midway of each inner lead 5, mechanical stresses occurring during the fabrication process of these semiconductor devices can be substantially relieved resulting in increased device yields. These stresses occur from the transport and handling of the semiconductor device after inner lead/chip pad connection having been accomplished and stresses that occur during setting of the sealing resin during either chip active surface or semiconductor device encapsulation. As a result of the employment of a larger spatial interval in combination with a lead slack portion, in the form of either a lengthened lead or slack lead portion in proximity to the region of the spatial interval, these stresses are absorb and their resulting bad affects relaxed. Consequentially, reduced lead breaks or cracks and the reduced occurrence or development of poor pad/lead connections is achieved resulting in the production of semiconductor devices characterized by high yield and reliability.

Further, the provision of cut-out portions or slots 9 along the edge of apertures 3 extending into film carrier 1, forming film carrier tongue portions or flexible carrier support members 1B interposed between cut-out portions 9 which resiliently support individual inner leads 5 results in the substantial elimination of the concentration of forces along any portion of inner leads 5. Consequentially, inner leads 5 are resiliently supported so that the imposition of forces concentrated along any part of their length can be effectively absorbed resulting in a substantial reduction in the development of lead breaks or cracks during fabrication as well as after fabrication during device utilization subjected to continuous operating temperature changes. Further, these flexible members also help reduce the development over time of poor inner lead/chip pad connections due to the continued presence of such forces. Thus, high yield and reliability can be achieved in the fabrication of semiconductor devices by the practice of this invention.

While the invention has been described in conjunction with several specific embodiments, it is evident to those skilled in the art that many further alternatives, modifications and variations will be apparent in light of the forgoing description. Although foregoing explanation of the several embodiments has been made in terms of a three-layer film carrier wherein conductive pattern leads 4 are secured by adhesive 6 to the surface of film carrier 1, it will be appreciated by those skilled in the art that the present invention applies equally as well to two-layer film carriers where conductive patterns are laminated directly onto the surface of the film carrier. Thus, the invention described herein is intended to embrace all such alternatives, modifications, applications and variations that may fall within the spirit and scope of the appended claims.

What is claimed is:

1. A semiconductor device comprising a semiconductor chip mounted within an aperture formed in a film carrier having a planar surface, a lead pattern comprising a plurality of spatially disposed conductive leads formed on said planar surface with inner lead ends projected into and over a peripheral edge of said film carrier aperture for bonding to respective electrode pads on an active surface of said semiconductor chip, and encapsulation means formed relative to said semiconductor chip active surface or said semiconductor chip and portions of said inner leads with a sealing resin, the improvement comprising the formation of a spatial interval between the peripheral edge of said film carrier aperture and outer peripheral sides of said semiconductor chip positioned within said film carrier aperture within the range of about 0.4 mm to 0.8 mm.

2. The semiconductor device of claim 1 wherein the portion of said inner leads extending across the regions of said spatial interval are provided with a corresponding additional length to span said interval so that said inner leads are more pliant and flexible due to their additional length.

3. A semiconductor device comprising a semiconductor chip mounted within a device aperture formed in a film carrier having a lead pattern comprising a plurality of spatially disposed conductive leads formed on a surface of said film carrier with inner lead ends thereof projected into and over said device aperture for bonding to respective electrode pads on an active surface of said semiconductor chip, and encapsulation means formed relative to said semiconductor chip active surface or said semiconductor chip and portions of said inner leads with a sealing resin, the improvement comprising a plurality of spatially disposed slits formed into said film carrier along at least one edge of said device aperture, said slits parallel to and formed between adjacent inner leads along said device aperture edge.

4. The semiconductor device of claim 3 wherein said slits are long and narrow shaped elongated slots formed in said film carrier extending away from said device aperture.

5. The semiconductor device of claim 3 wherein said slits form extended tongue portions upon which said inner leads are supported, said tongue portions being flexible permitting said inner leads to absorb stresses imposed upon them during device fabrication or subsequent device handling or utilization.

6. A semiconductor device comprising a semiconductor chip mounted within a device aperture formed in a film carrier having a lead pattern comprising a plurality of spatially disposed conductive leads formed on a surface of said film carrier with inner lead ends projected into and over said device aperture for bonding to respective electrode pads on an active surface of said semiconductor chip, and encapsulation means formed relative to said semiconductor chip active surface or said semiconductor chip and portions of said inner leads with a sealing resin, a spatial interval formed between the edge of said aperture and the outer side periphery of said semiconductor chip positioned within said device aperture is set within the range of about 0.4 mm to 0.8 mm, the portion of said inner leads extending across the regions of said spatial interval provided with an extended length, and a plurality of spatially disposed slits formed into said film carrier along at least one edge of said device aperture, said slits parallel to and formed between adjacent inner leads along said device aperture edge.

7. The semiconductor device of claim 6 wherein said slits are long and narrow shaped elongated slots formed in said film carrier extending away from said device aperture.

8. The semiconductor device of claim 7 wherein said slits form extended tongue portions upon which said inner leads are supported, said tongue portions being flexible permitting said inner leads to absorb stresses imposed upon them during device fabrication or subsequent device handling or utilization.

9. A semiconductor device comprising a semiconductor chip mounted within a device aperture formed in a film carrier having a lead pattern comprising a plurality of spatially disposed conductive leads formed on a surface of said film carrier with inner lead ends projected into and over said device aperture for bonding to respective electrode pads on an active surface of said semiconductor chip, and encapsulation means formed relative to said semiconductor chip active surface or said semiconductor chip and portions of said inner leads with a sealing resin, a spatial interval formed between the edge of said aperture and the outer side periphery of said semiconductor chip positioned within said device aperture is set within the range of about 0.4 mm to 0.8 mm, the portion of said inner leads extending across the regions of said spatial interval provided with an increase in the length to produce a region of lead slack substantially midway along the length of said inner leads, and a plurality of spatially disposed slits formed into said film carrier along at least one edge of said device aperture, said slits parallel to and formed between adjacent inner leads along said device aperture edge.

10. The semiconductor device of claim 9 wherein said slack region comprises a bent elbow portion formed in each of said inner leads in the regions of said inner leads extending across said spatial interval.

11. The semiconductor device of claim 10 wherein said slits are long and narrow shaped elongated slots formed in said film carrier extending away from said device aperture.

12. The semiconductor device of claim 11 wherein said slits form extended tongue portions upon which said inner leads are supported, said tongue portions being flexible permitting said inner leads to absorb stresses imposed upon them during device fabrication or subsequent device handling or utilization.

13. A semiconductor device comprising a semiconductor chip mounted within an aperture formed in a film carrier having a planar surface, a lead pattern comprising a plurality of spatially disposed conductive leads formed on said planar surface with inner lead ends projected into and over a peripheral edge of said film carrier aperture for bonding to respective electrode pads on an active surface of said semiconductor chip, and encapsulation means formed relative to said semiconductor chip active surface or said semiconductor chip and portions of said inner leads with a sealing resin, a spatial interval formed between the peripheral edge of said film carrier aperture and outer peripheral sides of said semiconductor chip positioned within said film carrier aperture is set within the range of about 0.4 mm to 0.8 mm, and the portion of said inner leads extending across the regions of said spatial interval provided with an increase in length to produce a region of lead slack substantially midway along the length of said inner leads so that the length of said leads are extended to enhance their pliancy and resiliency after said inner leads have been bonded to said semiconductor chip to reduce the risk of lead breakage during subsequent handling prior to encapsulation with said sealing resin 14. The semiconductor device of claim 13 wherein said slack region comprises a bent elbow portion formed in each of said inner leads in the regions of said inner leads extending across said spatial interval.

15. A semiconductor device comprising a semiconductor chip mounted within a device aperture formed in a film carrier having a lead pattern comprising a plurality of spatially disposed conductive leads formed on a surface of said film carrier with inner lead ends projected into and over said device aperture for bonding to respective electrode pads on an active surface of said semiconductor chip, and encapsulation means formed relative to said semiconductor chip active surface or said semiconductor chip and portions of said inner leads with a sealing resin, a spatial interval formed between the edge of said aperture and the outer side periphery of said semiconductor chip positioned within said device aperture, the portion of said inner leads extending across the regions of said spatial interval provided with an increase in length to produce a region of lead slack substantially midway along the length of said inner leads, and a plurality of spatially disposed slits formed into said film carrier along at least one edge of said device aperture, said slits parallel to and formed between adjacent inner leads along said device aperture edge.

16. The semiconductor device of claim 15 wherein said slack region comprises a bent elbow portion formed in each of said inner leads in the regions of said inner leads extending across said spatial interval.

17. The semiconductor device of claim 16 wherein said slits are long and narrow shaped elongated slots formed in said film carrier extending away from said device aperture.

18. The semiconductor device of claim 17 wherein said slits form extended tongue portions upon which said inner leads are supported, said tongue portions being flexible permitting said inner leads to absorb stresses imposed upon them during device fabrication or subsequent device handling or utilization.

* * * * *